(12) United States Patent
Kroeninger et al.

(10) Patent No.: US 7,759,163 B2
(45) Date of Patent: Jul. 20, 2010

(54) SEMICONDUCTOR MODULE

(75) Inventors: Werner Kroeninger, Regensburg (DE);
Josef Schwaiger, Teugn (DE); Ludwig Schneider, Parkstetten (DE); Ottmar Geitner, Pentling (DE); Markus Brunnbauer, Lappersdorf (DE);
Thorsten Meyer, Regensburg (DE);
Ralf Otremba, Kaufbeuren (DE); Josef Hoeglauer, Munich (DE); Helmut Strack, Munich (DE); Xaver Schloegel, Sachsenkamm (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/105,837

(22) Filed: Apr. 18, 2008

(65) Prior Publication Data

US 2009/0261468 A1      Oct. 22, 2009

(51) Int. Cl.
*H01L 21/00*        (2006.01)
*H01L 23/48*        (2006.01)

(52) U.S. Cl. ...................... 438/113; 257/690

(58) Field of Classification Search .............. 438/106,
438/110, 112, 113, 127, 464; 257/690, 678,
257/E21.502, E21.002, E21.001, E21.499,
257/E23.141, E23.001
See application file for complete search history.

(56) References Cited

U.S. PATENT DOCUMENTS

| 6,133,634 | A  | 10/2000 | Joshi |
| 6,582,990 | B2 | 6/2003  | Standing |
| 6,624,512 | B2 | 9/2003  | Kurusu |
| 6,677,669 | B2 | 1/2004  | Standing |
| 6,767,820 | B2 | 7/2004  | Standing et al. |
| 6,890,845 | B2 | 5/2005  | Standing et al. |
| 2002/0048905 | A1* | 4/2002 | Ikegami et al. .............. 438/464 |
| 2003/0036257 | A1  | 2/2003 | Masumoto et al. |

OTHER PUBLICATIONS

Quirk, Semiconductor manufacturing technology, 2001, Prentice-Hall, pp. 77, 82, 83, and 574.*
"Embedded Wafer Level Ball Grid Array (eWLB)", M. Brunnbauer, et al., Electronics Packaging Technology Conference, IEEE 2006.

* cited by examiner

*Primary Examiner*—Thomas L Dickey
*Assistant Examiner*—Nikolay Yushin
(74) *Attorney, Agent, or Firm*—Dicke, Billig & Czaja, PLLC

(57) ABSTRACT

A semiconductor module. One embodiment provides at least two semiconductor chips placed on a carrier. The at least two semiconductor chips are then covered with a molding material to form a molded body. The molded body is thinned until the at least two semiconductor chips are exposed. Then, the carrier is removed from the at least two semiconductor chips. The at least two semiconductor chips are singulated.

17 Claims, 6 Drawing Sheets

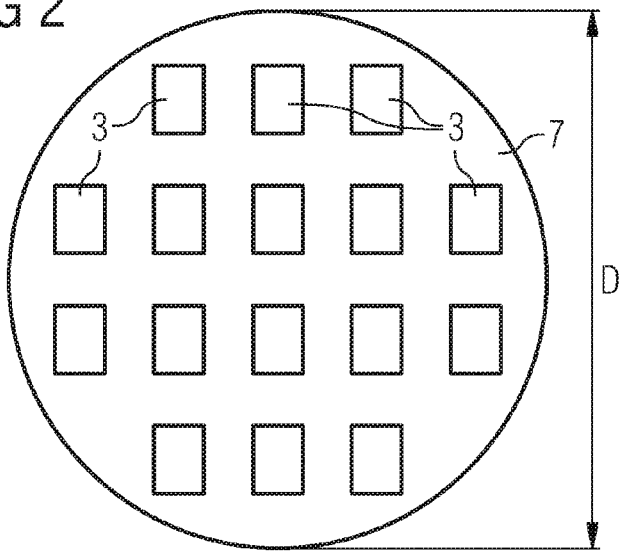
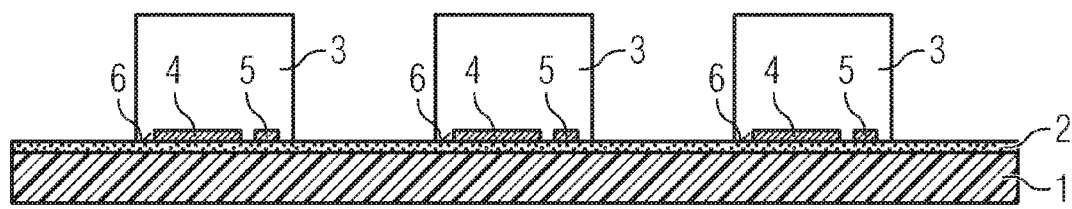
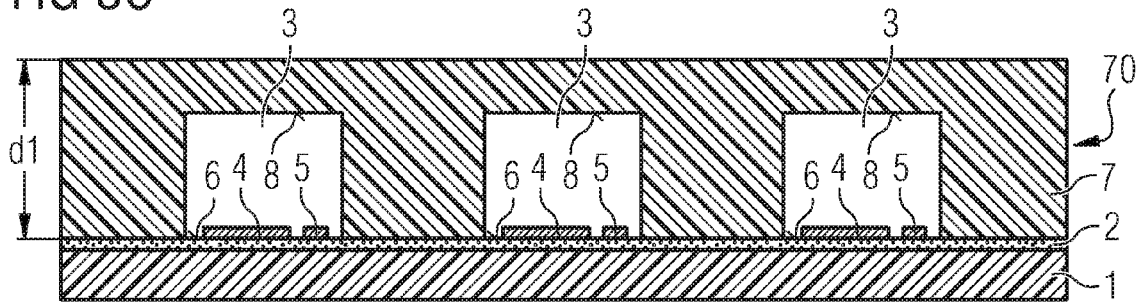

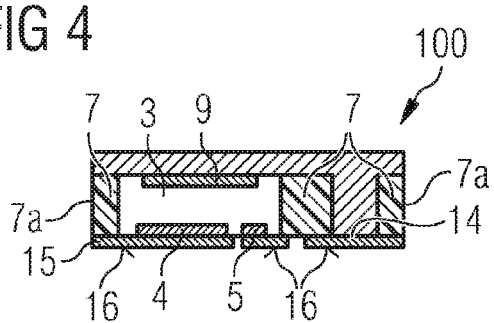
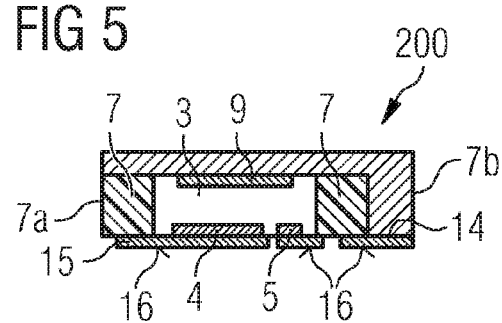
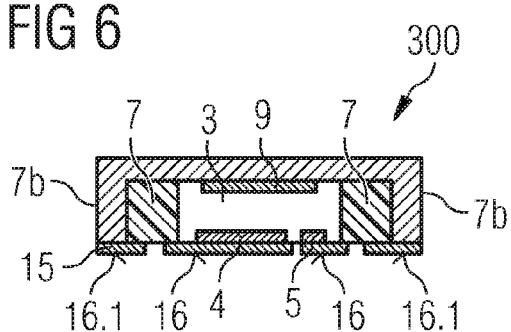
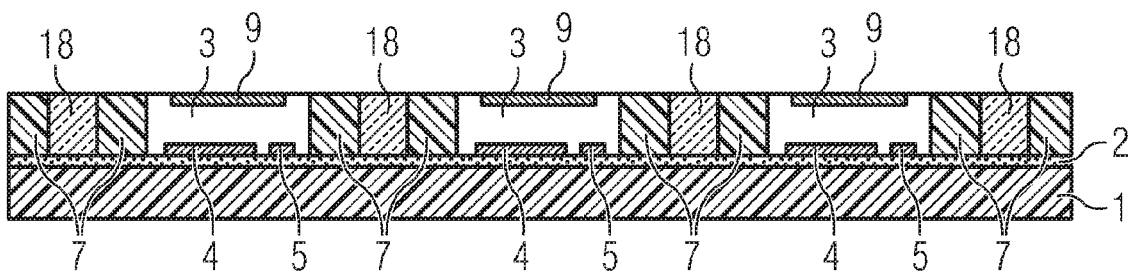
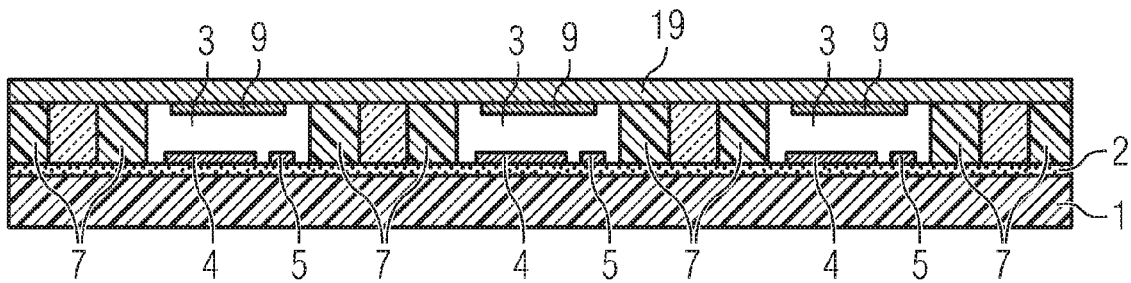

SEMICONDUCTOR MODULE

BACKGROUND

The invention relates to a semiconductor module and a method of manufacturing the same.

Semiconductor chips may be packaged. Semiconductor devices may be fabricated by separating single dies from a wafer, rearranging them on a carrier and packaging them in plastics. Cost efficient packages and methods of packaging are highly desired in the art.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 2 illustrates a top view of the structure illustrated in FIG. 1E;

FIGS. 3A to 3G schematically illustrate one embodiment of a method to fabricate a module.

FIG. 4 schematically illustrates a first module in a cross section according to one embodiment.

FIG. 5 schematically illustrates a second module in a cross section according to one embodiment.

FIG. 6 schematically illustrates a third module in a cross section according to one embodiment.

FIGS. 7A to 7D schematically illustrate one embodiment of a method to fabricate a module.

DETAILED DESCRIPTION

Figure 1A:
FIGS. 1A to 1E schematically illustrate one embodiment of a method to fabricate a module.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Modules containing semiconductor chips are described below. The semiconductor chips may be of extremely different types and may include for example integrated electrical or electro-optical circuits. The semiconductor chips may, for example, be configured as power semiconductor devices such as power transistors, power diodes, IGBTs (Insulated Gate Bipolar Transistors), logic circuits, control circuits, microprocessors or microelectro-mechanical components.

In one embodiment, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements in one embodiment on its two main surfaces, that is to say on its top side and bottom side. In one embodiment, power transistors and power diodes may have a vertical structure. Further, RF (Radio Frequency) chips may be equipped with contact elements on both main surfaces.

By way of example, the source terminal and gate terminal of a power transistor, e.g., a MOSFET (Metal Oxide Semiconductor Field-Effect Transistor), and the anode terminal of a power diode, e.g., a Schottky-diode, may be situated on one main surface, while the drain terminal of the power transistor and the cathode terminal of the power diode are arranged on the other main surface. Furthermore, the modules described below may include integrated circuits to control the integrated circuits of other semiconductor chips, for example, the integrated circuits of power transistors or power diodes. The semiconductor chips need not be manufactured from specific semiconductor material and, furthermore, may contain inorganic and/or organic materials that are not semiconductors, such as for example insulators, plastics or metals.

The semiconductor chips have contact elements (also referred to as contact pads) which allow electrical contact to be made with the semiconductor chips. The contact pads may be composed of any desired electrically conductive material, for example of a metal such as copper, aluminum or gold, a metal alloy or an electrically conductive organic material. In case of a power transistor, the contact pads include drain, source and gate terminals.

The modules further include a molded module body made of an electrically insulating molding material such as a resin, e.g., an epoxy-based material, a photoresist etc. The term "electrically insulating" refers to the property of the electrically insulating material to be at most only marginally electrically conductive relatively to electrically conductive components of the module. The molding material may be of any appropriate thermoplastic or thermosetting material. Various techniques may be employed to cover the semiconductor chips with the molding material, for example compression molding or injection molding. After curing, the molded body made of the molding material provides a rigid structure accommodating a plurality (e.g., typically more than 50) semiconductor chips. The molded body may have a shape of a disc or plate which has a lateral dimension of more than 0.2 or even 0.3 m. Such molded bodies accommodating a plurality of spaced-apart redistributed semiconductor chips are often termed "molded reconstituted wafer".

One or more electrically conductive layers may be applied to the embedded semiconductor chips. The electrically conductive layers may be used to make electrical contact with the semiconductor chips from outside the modules and to make electrical connections among the semiconductor chips. The electrically conductive layers may be manufactured with any desired geometric shape and any desired material composition. The electrically conductive layers may, for example, be composed of linear conductor tracks, but may also be in the form of a layer covering an area. Any desired electrically conductive materials, such as metals, for example aluminum, gold or copper, metal alloys or organic conductors, may be used as the material. The electrically conductive layers need not be homogenous or manufactured from just one material, that is to say various compositions and concentrations of the materials contained in the electrically conductive layers are possible.

The modules described below may include external contact pads. The external contact pads may be accessible from outside the module and may allow electrical contact to be made with the semiconductor chips from outside the module. Furthermore, the external contact pads may be thermally conductive and may serve as heat sinks for dissipating the heat generated by the semiconductor chips. The external contact pads may be composed of any desired electrically conductive material, for example, of a metal, such as copper, aluminum or gold, a metal alloy or an electrically conductive organic material. Surfaces of the external contact pads may form an assembly plane. The assembly plane may serve to mount the module onto another component, such as a circuit board for example.

FIGS. 1A to 4E exemplify stages of fabrication of a molded body embedding semiconductor chips. Such molded body is also known as reconstituted wafer in the art. In a first process (FIG. 1A) a carrier 1 is provided. The carrier 1 may be rigid or may be flexible to a certain degree and may be fabricated from materials such as metals, metal alloys or plastics. The carrier 1 may be electrically conductive or insulating. An adhesive tape 2 may be laminated on the carrier 1. The adhesive tape 2 may be a double sided sticky tape. In one embodiment, a glue material or any other adhesive material or mechanical securing means (such as a clamping device or a vacuum generator) may be associated with the carrier 1.

Figure 1B:
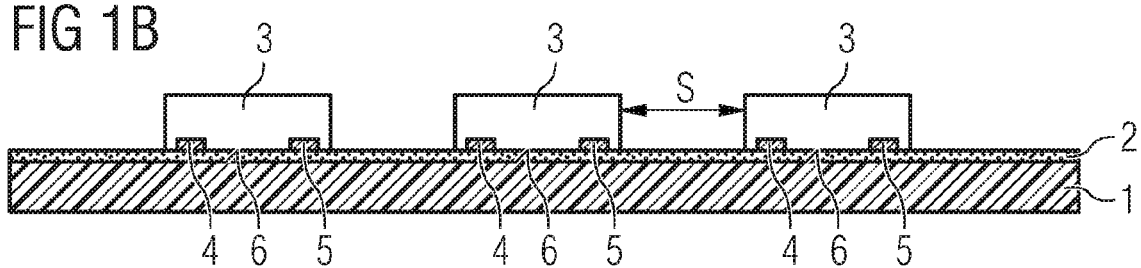

In FIG. 1B semiconductor chips 3 are placed on the carrier 1 and fixed by using the adhesive tape 2 or other appropriate equipment. The distance S between neighboring semiconductor chips 3 may be in the range between 0.25 mm and 10 mm. It is to be noted that throughout FIGS. 1A to 1E, only a partial section of the molded body is illustrated, that is to say in practice, typically much more than three semiconductor chips 3 are placed on the carrier 1.

Semiconductor chips 3 may have contact pads 4, 5 on a second main chip surface 6 facing the carrier 1. If the semiconductor chips 3 are power transistors, the contact pad 4 may be a source terminal and the contact pad 5 may be a gate terminal. In other cases, e.g., if the semiconductor chip 3 is a power diode, only one contact pad (e.g., the anode terminal) may be provided on the second main chip surface 6. If the semiconductor chip 3 is a logic integrated circuit, typically several contact pads 3, 4 are arranged on the second main chip surface 6. It is to be noted that the second main chip surface 6 typically forms the active surface of the semiconductor chip 3.

Figure 1C:
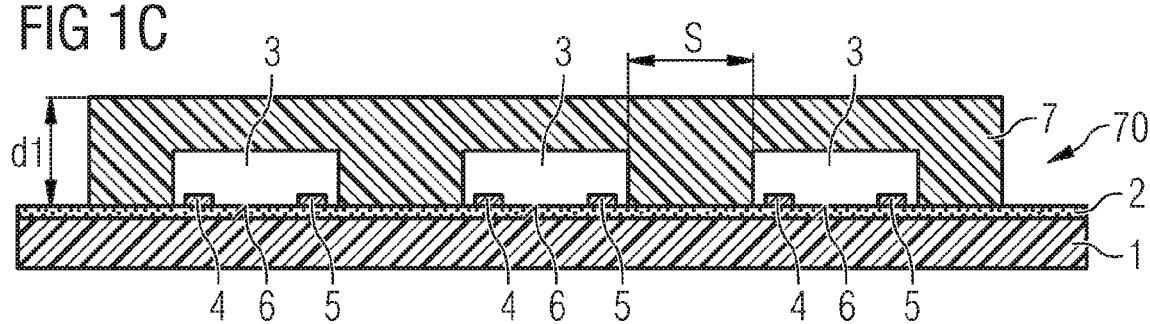

An electrically insulating molding material 7 may be applied to the semiconductor chips 3 and the carrier 1, see FIG. 1C. The molding material 7 may be used to encapsulate the semiconductor chips 3 except their bottom second main chip surface 6 containing the contact pads 4, 5. The molding material 7 may be an epoxy or another appropriate material used in contemporary semiconductor packaging technology. It may also be a photoresist such as SU8, which is epoxy-based. The molding material 7 may be composed of any appropriate thermoplastic or thermosetting material. After curing, the molding material 7 provides stability to the array of semiconductor chips 3. Various techniques may be employed to cover the semiconductor chips 3 with the molding material 7, for example compression molding or injection molding.

By way of example, in a compression molding process the liquid molding material 7 is dispensed into an open lower mold half of which the carrier 1 forms the bottom. Then, after dispensing the liquid molding material 7, an upper mold half is moved down and spreads out the liquid molding material 7 until a cavity between the carrier 1 forming the bottom of the lower mold half and the upper mold half is completely filled. This process may be accompanied by the application of heat and pressure. After curing, the molding material 7 is rigid and forms a molded body. The larger the lateral size of the molded body 70 ("molded reconstituted wafer") and the number of embedded chips 3, the more cost efficient the process will typically be.

Figure 1D:
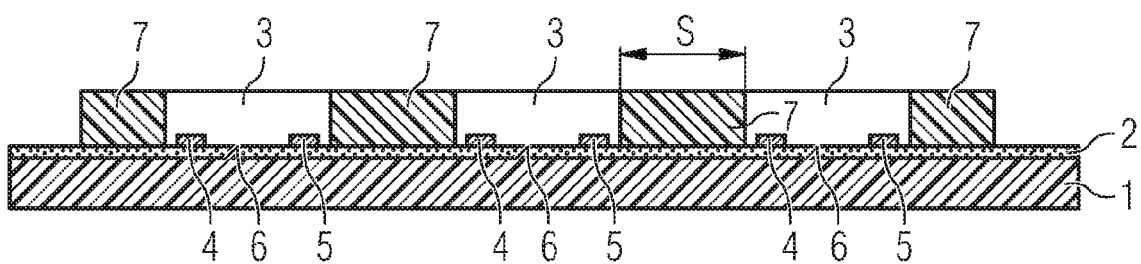

As may be seen from FIG. 1C, the semiconductor chips 3 may be completely over-molded, i.e. completely covered by molding material 7. In a subsequent step, the molded body is thinned (FIG. 1D). Grinding or lapping machines may be used that are similar or identical to the machines used for semiconductor wafer grinding or lapping in frontend technology. Whilst grinding tools use an abrasive wheel, lapping tools use a fluid charged with a "rolling" abrasive particles acting between two surfaces. In one embodiment, etching may be used to reduce the thickness of the molding material 7. Thinning of the molding material 7 is continued until at least the upper main surface 8 of the semiconductor chip 3 is exposed. As will be explained in more detail later in conjunction with FIGS. 3A-G, thinning may further be continued to also reduce the thickness of the semiconductor chips 3.

By way of example, the molded body 70 in FIG. 1C may have a thickness d1 of about a couple of hundred micrometers, e.g., more than 200 µm, 500 µm or even more than 1000 µm. Thickness d1 is greater than the thickness of the semiconductor chips 3. As semiconductor wafers are often fabricated with a thickness of about 500 µm or 1000 µm, and may be ground in frontend processes to be as small as about 200 µm or even less, the thickness of the semiconductor chip 3 before thinning may be e.g., in a range of about 200 µm to 1000 µm. As an specific example, the semiconductor chips 3 may have a thickness of about 450 µm and d1 may be about 650 µm. After thinning, the thickness of the molded body 70 may be reduced to the thickness of the semiconductor chips 3. Thus, the semiconductor chips are exposed by thinning, and no molding material 7 remains on the upper surface of the semiconductor chips 3. In other words, after thinning, the newly generated upper surface of the molded body 70 is composed of molding material 7 and semiconductor material and thus resembles the lower surface of the molded body 70 facing the carrier 1.

Figure 1E:
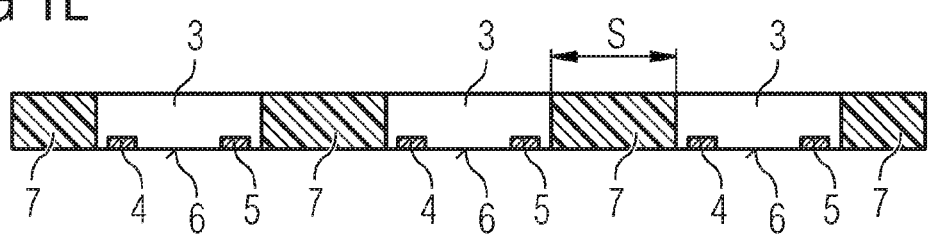

In FIG. 1E, the molded body 70 is released from the carrier 1. To this end, the adhesive tape 2 may feature thermo-release properties, which allow the removal of the adhesive tape 2 during a heat treatment. The removal of the adhesive tape 2 from the molded body 70 including the semiconductor chips 3 is carried out at an appropriate temperature which depends on the thermo-release properties of the adhesive tape 2 and is usually higher than 150° C., in one embodiment approximately 200° C. FIG. 2 illustrates a top view on the molded body 70, which is also referred to as artificial or reconstituted wafer in the art. The molded body 70 may e.g., be disc-shaped having a diameter D of e.g., 200 or 300 mm, or may have any other shape such as a polygonal shape and the same or other lateral dimensions.

The thinning strongly facilitates the further processing of the molded body 70 in subsequent processes, because it removes warpage or bow from the molded body 70. Without thinning, an upper layer near the upper surface of the molded body is made exclusively of molding material 7, whereas a lower layer near the lower surface of the molded body 70 is a made alternately of semiconductor material and molding material 7. As the coefficient of thermal expansion (CTE) of the semiconductor material is usually different from the CTE of the molding material 7, the overall lateral expansion near or at the upper surface of the molded body 70, without thinning, is different to the overall lateral expansion near or at the lower surface of the molded body 70. For instance, the semiconductor chips may have e.g., a CTE of about $2.8 \cdot 10^{-6}/K$ (silicon) and the mold material 7 may have e.g., a CTE in the range between 20 and $200 \cdot 10^{-6}/K$. This typically result in a warpage or bow of the molded body 70 (i.e. artificial or reconstituted wafer) of more than 1 or several millimeters in surface level difference. Thinning, however, causes the upper surface and the lower surface to have the same composition and therefore the same overall lateral expansion. Therefore, warpage or bow is removed by thinning. This results in that the molded body 70, after thinning, is substantially flat, and further processing is greatly facilitated. In one embodiment, all subsequent processes may be performed without any carrier for holding or clamping the molded body 70. Such carriers are conventionally required for forcing the bowed molded body 70 in a flat configuration during further processing.

Subsequent processes include the application of an electrical interconnect such as one or more metal redistribution layers and dicing. These processes are described in more detail below in conjunction with further embodiments.

FIGS. 3A to 3G exemplify stages of fabrication of a semiconductor module. Again, in a first process (FIG. 3A) a carrier 1 is provided. This process as well as the carrier 1 and the adhesive tape 2 have been described earlier in conjunction with FIG. 1A.

Figure 3D:
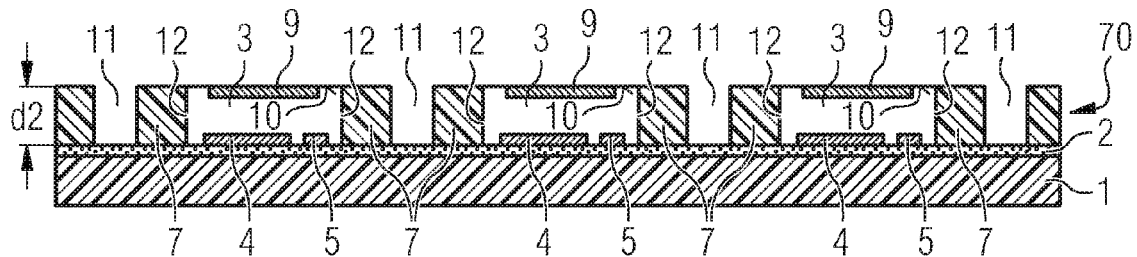

In FIG. 3B semiconductor chips 3 are placed on the carrier 1 and fixed by using the adhesive tape 2 or other appropriate equipment. It is to be noted that throughout FIGS. 3A to 3G, only a partial section of the arrangement is illustrated, that is to say in practice, typically much more than three semiconductor chips 3 are placed on the carrier 1.

Semiconductor chips 3 may have contact pads 4, 5 on a second main chip surface 6 facing the carrier 1. The same type of semiconductor chips as mentioned before may be used.

An electrically insulating molding material 7 may be applied to the semiconductor chips 3 and the carrier 1, see FIG. 1C. The molding material 7 may be used to encapsulate the semiconductor chips 3 except their bottom second main chip surface 6 containing the contact pads 4, 5. The molding material may be of the same material and may be applied the same way as described earlier in conjunction with FIG. 1C.

As may be seen from FIG. 3C, the semiconductor chips 3 may be completely over-molded, i.e. completely covered by molding material 7. In a subsequent process, the molded body is thinned (FIG. 3D). The same technologies and tools as mentioned before may be applied. Thinning of the molding material 7 is continued until at least the upper main surface 8 of the semiconductor chip 3 is exposed. Typically, thinning is further continued to also reduce the thickness of the semiconductor chips 3.

By way of example, the molding material 7 in FIG. 3C may have a thickness d1 of about a couple of hundred micrometers, e.g., more than 200 µm, 500 µm or even more than 1000 µm. Thickness d1 is greater than the thickness of the semiconductor chips 3. As semiconductor wafers are often fabricated with a thickness of about 500 µm or 1000 µm, and may be ground in frontend processes to be as small as about 200 µm or even less, the thickness of the semiconductor chip 3 before thinning may be e.g., in a range of about 200 µm to 1000 µm. After thinning, the thickness of the molded body 70 may be reduced to be in a range of e.g., about 50 µm to 200 µm. That way, also the thickness of the semiconductor chips 3 is reduced to the same dimension. It is to be noted that the second main chip surface 6 forms the active surface of the semiconductor chip 3 and therefore, the function of the semiconductor chip 3 will not be negatively effected by the grinding process.

After grinding, the newly generated surface of the molded body 70 is composed of molding material 7 and semiconductor material. This surface is cleaned by appropriate cleaning methods such as HF etching. Then, contact pads 9 are generated on the first main chip surface 10. The first main chip surface 10 may be the initial upper chip surface 8 (if grinding or lapping is only used to expose the initial upper chip surface 8) or may be a main chip surface newly generated by the grinding or lapping process.

Many processes for generating the contact pads 9 on the first main chip surface 10 are known in the art. By way of example, a Ti or Al layer of about 100 nm thickness may be deposited on the cleaned first main chip surface 10. This metal layer may be coated by another metal layer of e.g., Ag or Ni, which may also have a thickness of about 100 nm.

In FIG. 3D, channels 11 are provided which extend through the molding material 7 of the molded body 70. These channels 11 may be of any shape, e.g., may have a slit-like shape or a column-like shape. The channels 11 are through-holes, i.e. open to both surfaces of the molded body 70. The channels 11 may have a lateral dimension or diameter in the range between 10 µm and 500 µm, more specifically between 50 µm and 100 µm. Further, if high currents are to be conducted, a plurality of channels 11 may be provided for each semiconductor chip 3. The channels 11 may be located in a spaced apart relationship to the semiconductor chips 3 such that the semiconductor chips 3 remain covered with molding material 7 at their side faces 12.

The channels 11 may be generated by drilling such as mechanical drilling or laser drilling. Another possibility is to use a photochemical process (photolitography, etching) in order to produce the channels 11. Further, it may also be possible to introduce the channels 11 at an earliest stage of the fabrication process, e.g., during the molding process. In this case, the upper mold half may be equipped with rods or blades or any elements having a positive shape of the channels 11. FIG. 3D illustrates the molded body 70 after grinding, contact pad 9 formation and generation of the channels 11.

After the structuring of the molding material 7, a conductive layer 13 is applied to the molded body 70. The conductive layer 13 may consist of a seed layer (not illustrated) and a further layer which is galvanically deposited onto the seed layer. An electroless deposition method may be used to produce the seed layer. The seed layer may have a thickness of up to 1 µm and may, for example, be made of zinc. The electrical conductivity of the seed layer may be used to galvanically deposit an electrically conductive layer, for example a copper layer, on the seed layer. The copper layer may have virtually any desired thickness depending on the application and current requirements. By way of example, the thickness of the copper layer may be in a range between 50 µm and 200 µm. As an alternative to the galvanic plating process described above, an electroless plating process such as electroless nickel plating may be used. Electroless plating is also referred to as chemical plating in the art. Further, other deposition methods such as physical vapor deposition (PVD), chemical vapor deposition (CVD), sputtering, spin-on processes, spray deposition or ink-jet printing may be employed to form the conductive layer 13.

The conductive layer 13 electrically contacts the contact pads 9 on the first main chip surface 10 and fills the channels 11. As a result, the bottom face of the conductive layer 13 within the channel 11 forms a contact terminal 14 which is exposed at the lower surface of the molded body 70. Thus, the conductive layer 13 provides for a wiring or interconnect structure to connect the "back side" chip contact pads 9 to a contact terminal 14 lying substantially in the same plane than the "front side" contact pads 4, 5 of the semiconductor chip 3.

In one embodiment, instead of using deposition methods, the wiring or interconnect structure may be generated using other techniques. By way of example, the channels 11 may be filled by a conductive material (e.g., solder) to provide for conductive elements extending through the channels, and a sheet of metal (e.g., copper) may be bonded to contact pads 9 on the first main chip surface 10 and to the conductive elements extending through the channels 11. This process will be explained later in more detail in conjunction with FIGS. 7A to 7D.

During fabrication, the conductive layer 13 (generated by deposition or applied as a metal sheet) may be structured. Structuring may result in regular pattern such as conductive lines. Structuring of the conductive layer 13 may be particularly useful if modules are intended to be manufactured which include a plurality of semiconductor chips 3 which are to be interconnected in a specific way.

Figure 3E:
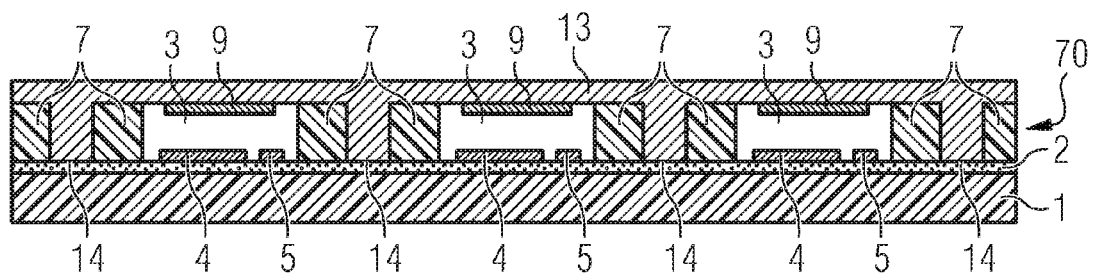
Figure 3F:
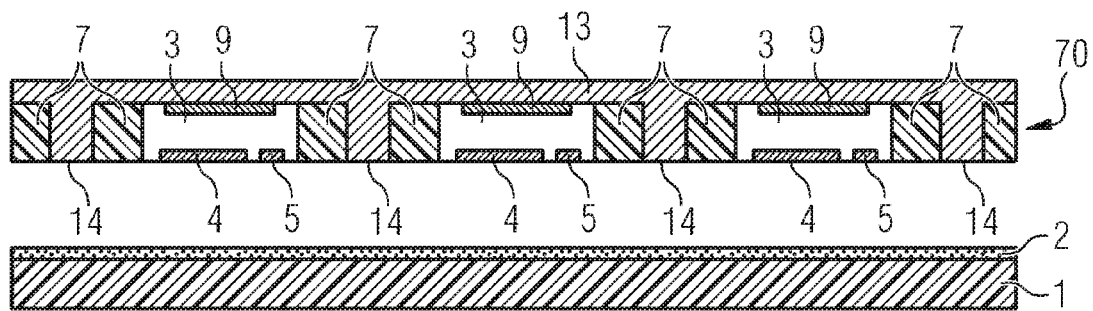

In FIG. 3F, the molded body 70 is released from the carrier 1 as described above. Due to the thinning procedure, the molded body 70 has no warpage or bow, i.e. is substantially flat.

It is to be noted that the release of the molded body 70 from the carrier 1 may also be accomplished at an earlier stage in the fabrication process, e.g., before applying the conductive layer 13 (FIG. 3E) or even before the generation of the channels 11 (FIG. 3D). As the molded body 70 has no warpage or bow, all method processes after the release of the molded body 70 are facilitated and may be performed without a specific carrier needed so far to adjust the molded body in a flat shape.

Figure 3G:
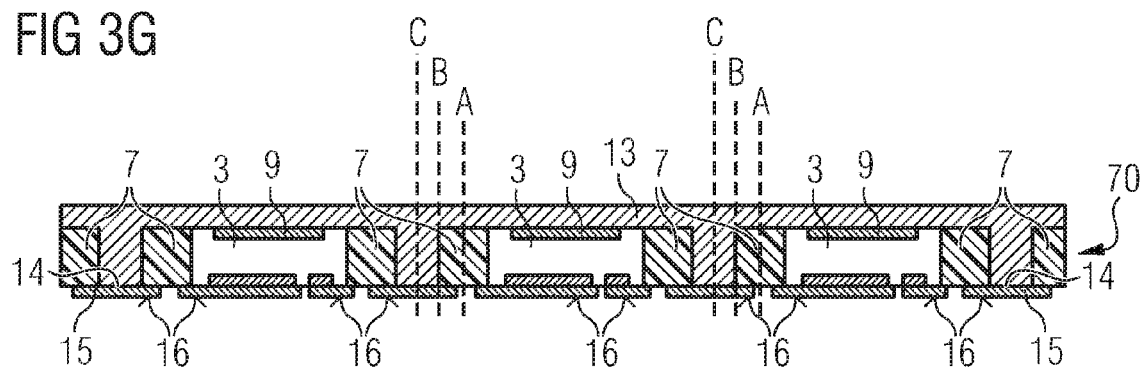

After the release of the carrier 1 and the adhesive tape 2, the bottom faces of the conductive elements extending through the channels 11, the bottom surface of the molding material 7 as well as the second main chip surface 6 containing the contact pads 4, 5 form a common plane. As illustrated in FIG. 3G, a bottom conductive layer 15 may optionally be applied to this common plane. Similar to the conductive layer 13, the bottom conductive layer 15 may include a seed layer (not illustrated) and a further layer which may be galvanically deposited onto the seed layer. The seed layer may be an electrolessly deposited zinc layer and may have a thickness of up to 1 µm. The galvanically deposited layer may be a copper layer with a thickness of, e.g., up to 200 µm, and, in one embodiment, in the range between 50 µm and 100 µm. Alternative methods to deposit the bottom conductive layer 15 may be employed as discussed above in connection with the fabrication of the conductive layer 13.

The bottom conductive layer 15 may be structured such that insular sections 16 are formed which are connected to the contact pad 4 (e.g., source terminal), contact pad 5 (e.g., gate terminal) and bottom face (e.g., drain terminal) of the conductive element extending through the channel 11. The separated sections 16 of the bottom conductive layer 15 may form external contact elements which enable to contact the drain, source and gate terminals of the semiconductor chip 3 (or, more generally spoken, various terminals located on opposite sides of the semiconductor chip 3) from outside. In other words, the separated sections 16 of the bottom conductive layer 15 may form an assembly plane which allows to mount modules (see e.g., FIGS. 4 to 6 and FIGS. 8 to 11) to be obtained from the molded body 70 onto a substrate such as e.g., a circuit board.

Further, the bottom conductive layer 15 may form a redistribution layer (RDL) at the assembly side of the modules. Instead of using one bottom conductive layer 15, a redistribution structure including a plurality of such redistribution layers could be generated. In such redistribution structure, several structured conductive layers are provided which are separated by polymer layers and interconnected by vias. Such redistribution structure may be fabricated by well-known thin-film technology processes and may provide a flexible signal routing and a design of the external terminals tailored to the customer's needs.

The molded body 70 is then separated to obtain single modules (FIG. 3G). Each module may contain one or more semiconductor chips 3. By way of example, separation may be performed at separation lines A, B, C. Separation may, for example, be accomplished by sewing.

FIGS. 4, 5 and 6 illustrate modules 100, 200, 300 obtained by separating the molded body 70 at separation lines A, B, C, respectively. According to separation line A, side faces 7a of module 100 made of molding material 7 are obtained. According to separation line B, one side face 7a of module 200 made of molding material 7 and one side face 7b of module 200 made of conductive material from the conductive layer 13 are obtained. According to separation line C, both side faces 7b of module 300 are made of conductive material from conductive layer 13. As a result, the modules 100, 200 and 300 have different properties in view of heat removal and their capability to be bonded to a heat sink. Further, the structural design of the bottom conductive layer 15 may depend on the choice of separation line A, B or C. By way of example, module 300 may have a circumferential or frame-shaped external drain terminal 16.1.

Figure 7C:
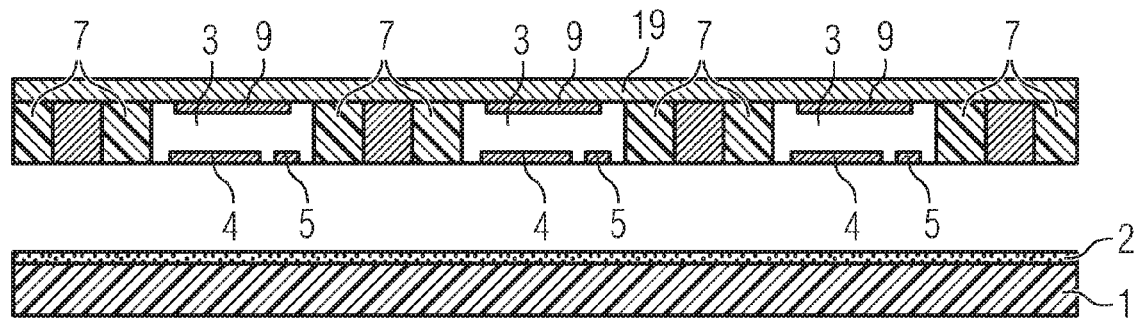
Figure 7D:
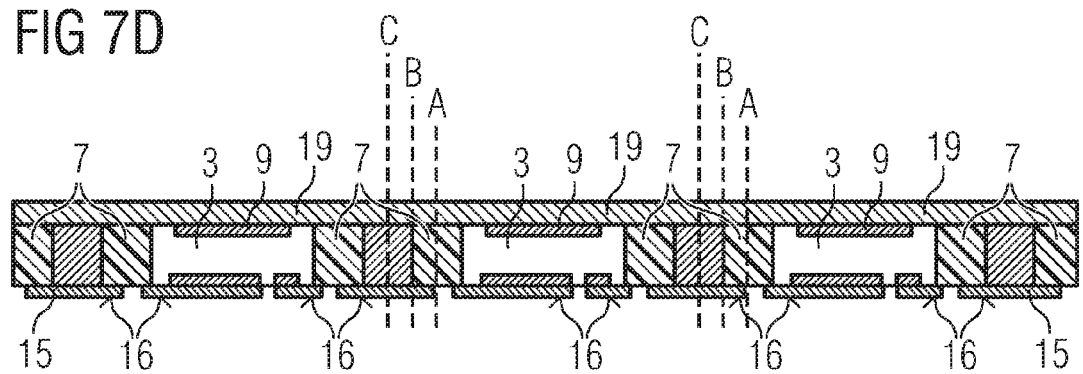
Figure 8:
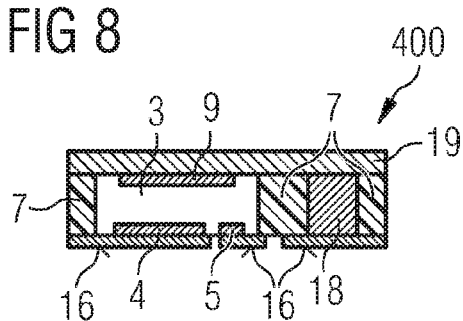
FIG. 8 schematically illustrates a fourth module in a cross section according to one embodiment.

In FIGS. 7A to 7D different stages of another manufacturing process to fabricate modules 400, 500, 600 illustrated in FIGS. 6, 7, 8, respectively, are illustrated. The first fabrication processes are the same as illustrated in FIGS. 3A to 3D, and reference is made to the corresponding description in order to avoid reiteration. Then, as illustrated in FIG. 7A, the channels 11 are filled with a conductive material e.g., a metal or solder. The conductive material forms conductive elements 18 extending through the channels 11.

The conductive material may be applied by printing techniques. By way of example a solder paste may be squeezed into the channels 11 by using a screen printing process. Other techniques may also be possible.

After filling the channels 11 with the conductive element 18, the conductive layer 13 is applied, see FIG. 7B. To this end, deposition methods as described in conjunction with the first embodiment (FIGS. 3A to 3G) may be used. In one embodiment, it is also possible to attach a metal sheet 19 (e.g., made of copper) to the upper side of the molded body 70. The metal sheet 19 may have any desired thickness, e.g., in a range between 50 µm and 200 µm. A conductive adhesive such as e.g., a solder deposit (not illustrated) is applied to each contact pad 9 and the metal sheet 19 is placed into contact with the upper side of the molded body 70. Then, by the application of heat, a solder reflow is used to bond the contact pads 9 and the contact elements 18 to the metal sheet 19 (FIG. 7B). As a result, a structure similar to the arrangement illustrated in FIG. 3E is obtained.

Figure 9:
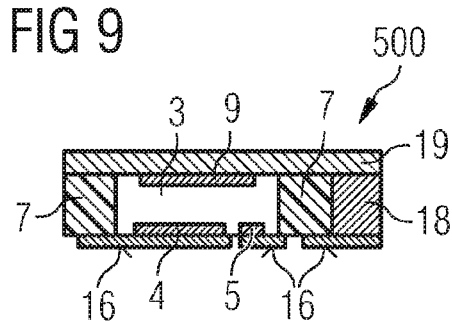
FIG. 9 schematically illustrates a fifth module in a cross section according to one embodiment.
Figure 10:
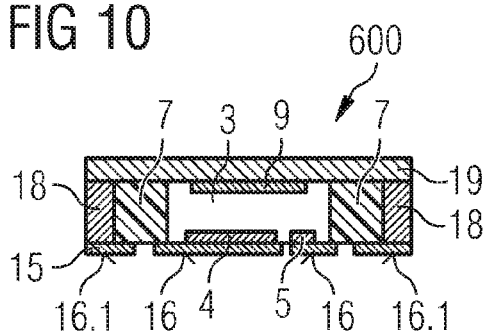
FIG. 10 schematically illustrates a sixth module in a cross section according to one embodiment.

The subsequent manufacturing processes of the second embodiment illustrated in FIGS. 7C and 7D correspond to the manufacturing processes described in conjunction with FIGS. 3F and 3G, respectively, of the first embodiment. Further, modules 400, 500, 600 illustrated in FIGS. 8, 9 and 10 are similar to modules 100, 200, 300 explained with reference to FIGS. 4, 5 and 6, respectively. If the conductive elements 18 are made of solder, the bottom conductive layer 15 may be omitted or removed under the conductive elements 18, and the solder of the conductive elements 18 may be used to directly bond the conductive elements 18 to a substrate.

The modules 100, 200, 300, 400, 500, 600 do not contain a carrier such as a leadframe. To the contrary, the electrically conductive layers 13 and 15 are plated on both main surfaces 6, 10 of the semiconductor chips 3. While the conductive layer 13 provides for a "back-side" interconnect, the bottom conductive layer 15 provides for a "front-side" interconnect as well as an assembly structure for mounting the module 100, 200, 300, 400, 500, 600 on a substrate. As the conductive layer 13 and the bottom conductive layer 15 are interconnected by contact elements 18 extending through channels 11, this makes it possible to arrange all external contact pads 16 on the bottom surface of the module 100, 200, 300, 400, 500, 600. Moreover, the surfaces of the external contact pads 16 connected to the drain and source terminals of the semiconductor chip 3 may be larger than the surface of the external contact pad 16 connected to the gate terminal of the semiconductor chip 3. The enlarged surfaces for the drain and source terminals may be useful when high currents flow through the vertical power device. The stability of the modules 100, 200, 300, 400, 500, 600 may be provided by the molding material 7.

Figure 11:
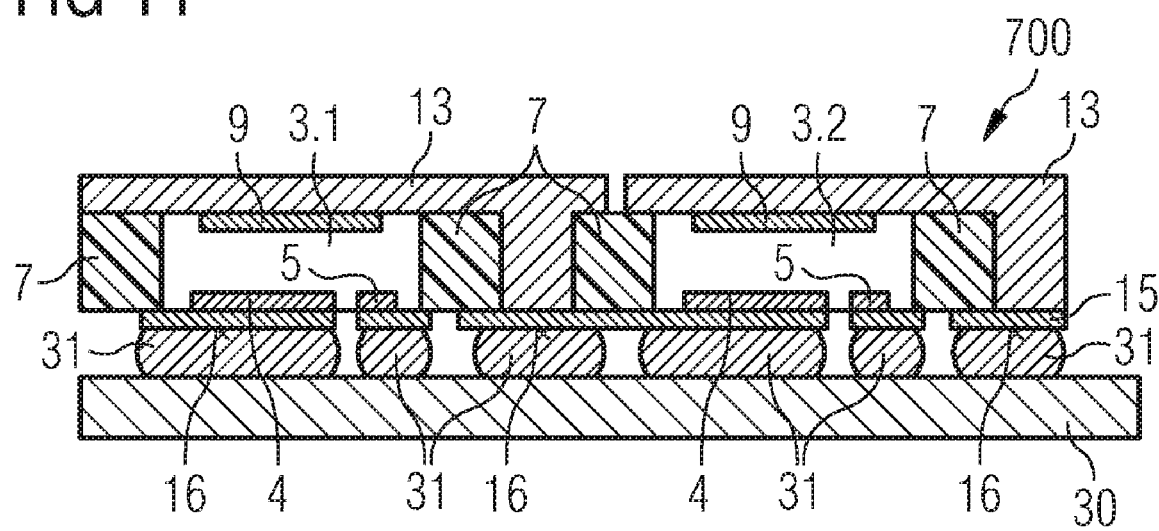
FIG. 11 schematically illustrates a device in a cross section according to one embodiment.
Figure 12:
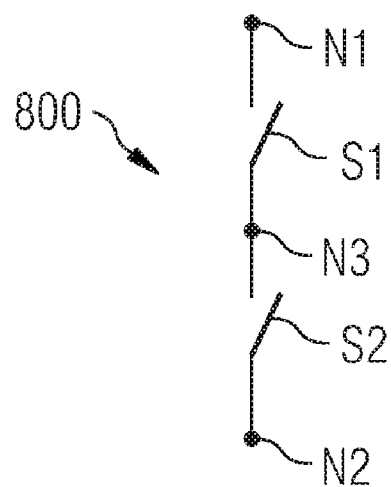
FIG. 12 illustrates a basic circuit diagram of a half-bridge.

In FIG. 11 an example of how two semiconductor chips 3.1, 3.2 may be connected to each other by using the conductive layer 13 (which may e.g., be realized by a deposited metal layer or a metal sheet 19) and the bottom conductive layer 15 is schematically illustrated. In module 700, by way of example, the two semiconductor chips 3.1, 3.2 are power transistors. The contact pad 9 (drain terminal) of the first semiconductor chip 3.1 is connected to the contact pad 4 (source terminal) of the second semiconductor chip 3.2 by the conductive layer 13 and the structured bottom conductive layer 15. Having the connection as illustrated in FIG. 11, the module 700 can be used as a half-bridge. A basic circuit of a half-bridge 800 arranged between two nodes N1 and N2 is illustrated in FIG. 12. The half-bridge 800 includes two switches S1 and S2 connected in series. The semiconductor chips 3.2 and 3.1 may be implemented as the two switches S1 and S2, respectively. When compared to the module 700 illustrated in FIG. 11, the node N1 is the drain terminal (contact pad 9) of semiconductor chip 3.2, the node N3 arranged between the two switches S1 and S2 is the drain terminal (contact pad 9) of the first semiconductor chip 3.1 and the node N2 is the source terminal (contact pad 4) of the first semiconductor chip 3.1.

The half-bridge 800 may, for example, be implemented in electronic circuits for converting DC voltages, DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage.

Returning to FIG. 11, the exposed surfaces 16 of the bottom conductive layer 15 forming the external contact pads of module 700 may be used to electrically couple the module 700 to other components. This is exemplarily illustrated in FIG. 11. There, the module 700 is mounted onto a substrate 30 such as a circuit board, for example a PCB (printed circuit board). Solder deposits 31 may have been used to solder the external contact pads to contact areas (not illustrated) of the circuit board 30. It is to be noted that the conductive layer 13 has been structured in order to electrically separate the drain terminals (contact pads 9) of the two semiconductor chips 3.1, 3.2.

On top of all modules 100, 200, 300, 400, 500, 600, 700, a heat sink or cooling element (not illustrated) may be attached. The heat sink may be thermally coupled to an insulating material (not illustrated) coating the structured conductive layer 13. If the thermal conductivity of the electrically insulating material is high enough and/or if the material thickness of the electrically insulating material above the conductive layer 13 is not too large, the electrically insulating material may allow to transfer the heat generated by the semiconductor chips 3.1 and 3.2 to the heat sink, which dissipates the generated heat. In this connection, it is to be noted that the metal sheet 19 may be specifically configured to form a mounting platform for a heat sink. By way of example, the metal sheet 19 may be equipped with a top insulating dielectric layer laminated onto the metal layer. Further, the metal sheet 19 may be part of a ceramic substrate, e.g., a DCB (direct copper bonded) substrate. Another possibility is to use a multi-layer metal-dielectric-metal sandwich structure for the metal sheet 19 to be applied to the molded body ("molded reconfigured wafer") 70. In this case, a heat sink may directly be bonded to the insulated metal surface of the multi-layer metal sheet 19.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, comprising:
   placing at least two semiconductor chips on a carrier;
   covering the at least two semiconductor chips with a molding material to form a molded body;
   thinning the molded body until the at least two semiconductor chips are exposed;
   removing the carrier from the at least two semiconductor chips; and
   singulating the at least two semiconductor chips after removal of the carrier.

2. The method of claim 1, further comprising:
   thinning the at least two semiconductor chips during the thinning of the molded body.

3. The method of claim 2, comprising thinning the at least two semiconductor chips to a thickness of less than 200 μm.

4. The method of claim 1, comprising wherein thinning is made by grinding or lapping.

5. The method of claim 1, comprising wherein before thinning, a main surface of the molded body embedding the at least two semiconductor chips has a bow of at least 1 mm difference in surface level height, and wherein the bow is substantially removed by the thing.

6. The method of claim 1, further comprising:
selectively removing a portion of the molding material from the carrier to selectively expose a portion of the carrier.

7. The method of claim 6, wherein selectively removing a portion of the molding material is performed by at least one of mechanical drilling, laser drilling and etching.

8. The method of claim 6, further comprising:
covering the selectively exposed portion of the carrier with a conductive element.

9. A method comprising:
placing at least two semiconductor chips on a carrier;
covering the at least two semiconductor chips with a molding material to form a molded body;
thinning the molded body until the at least two semiconductor chips are exposed;
applying a first layer of conductive material over the at least two semiconductor chips after thinning the molded body, wherein the first layer of conductive material electrically connects to a contact pad on the at least two semiconductor chips;
removing the carrier from the at least two semiconductor chips; and
singulating the at least two semiconductor chips after removal of the carrier.

10. The method of claim 9, comprising applying the conductive material of the first layer by a deposition process.

11. The method of claim 9, comprising applying the conductive material of the first layer by attaching a metal sheet to the contact pad.

12. A method comprising:
placing at least two semiconductor chips on a carrier;
covering the at least two semiconductor chips with a molding material to form a molded body;
thinning the molded body until the at least two semiconductor chips are exposed;
applying a first layer of conductive material over the at least two semiconductor chips after thinning the molded body, wherein the first layer of conductive material electrically connects to a contact pad on the at least two semiconductor chips;
removing the carrier from the at least two semiconductor chips;
depositing a second layer of conductive material over a main surface of the at least two semiconductor chips which has been released from the carrier; and
singulating the at least two semiconductor chips.

13. The method of claim 12, further comprising:
structuring the second layer of conductive material to form external terminals of the module.

14. A method of manufacturing a semiconductor device, comprising:
placing at least two semiconductor chips, each having a first main surface and a second main surface, on a carrier, wherein the second main surfaces are placed on the carrier;
covering the at least two semiconductor chips with a molding material to form a molded body;
thinning the molded body until semiconductor material of the first main surfaces of the at least two semiconductor chips is exposed;
removing the carrier from the at least two semiconductor chips; and
singulating the at least two semiconductor chips.

15. The method of claim 14, further including generating contact pads on the first main surfaces of the at least two semiconductor chips after the thinning.

16. The method of claim 15, further including:
providing channels extending through the molded body; and
forming an electrically conductive layer filling the channels interconnecting the contact pads on the first main surfaces to a contact terminal lying substantially in a same plane as contact pads on the second main surfaces of the at least two semiconductor chips.

17. A method of manufacturing a semiconductor device, comprising:
placing at least two semiconductor chips on a carrier;
covering the at least two semiconductor chips with a molding material to form a molded body;
thinning the molded body until the at least two semiconductor chips are exposed, wherein a thickness of the at least two semiconductor chips is reduced to a thickness which is less than a thickness of the at least two semiconductor chips before thinning;
removing the carrier from the at least two semiconductor chips; and
singulating the at least two semiconductor chips.

* * * * *

UNITED STATES PATENT AND TRADEMARK OFFICE
CERTIFICATE OF CORRECTION

| | |
|---|---|
| PATENT NO. | : 7,759,163 B2 |
| APPLICATION NO. | : 12/105837 |
| DATED | : July 20, 2010 |
| INVENTOR(S) | : Kroeninger et al. |

Page 1 of 1

It is certified that error appears in the above-identified patent and that said Letters Patent is hereby corrected as shown below:

Column 11, line 2, delete "thing." and insert in place thereof --thinning.--.

Signed and Sealed this

Ninth Day of November, 2010

David J. Kappos
*Director of the United States Patent and Trademark Office*